US008912572B2

(12) United States Patent
Heo

(10) Patent No.: US 8,912,572 B2
(45) Date of Patent: Dec. 16, 2014

(54) HIGH ELECTRON MOBILITY TRANSISTOR AND METHOD OF MANUFACTURING THE SAME

(71) Applicant: Samsung Electronics Co., Ltd., Suwon-Si, Gyeonggi-Do (KR)

(72) Inventor: Hong-Pyo Heo, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 18 days.

(21) Appl. No.: 13/833,979

(22) Filed: Mar. 15, 2013

(65) Prior Publication Data
US 2014/0077267 A1 Mar. 20, 2014

(30) Foreign Application Priority Data

Sep. 18, 2012 (KR) .................. 10-2012-0103608

(51) Int. Cl.
H01L 29/66 (2006.01)
H01L 29/10 (2006.01)
H01L 29/778 (2006.01)
H01L 29/20 (2006.01)

(52) U.S. Cl.
CPC .......... *H01L 29/778* (2013.01); *H01L 29/1029* (2013.01); *H01L 29/7787* (2013.01); *H01L 29/20* (2013.01); *H01L 29/2003* (2013.01); *H01L 29/66431* (2013.01)
USPC .............................................. 257/194

(58) Field of Classification Search
CPC .................. H01I 29/778; H01I 29/66431
USPC .............................................. 257/194
See application file for complete search history.

(56) References Cited

U.S. PATENT DOCUMENTS

| 7,038,253 | B2 | 5/2006 | Yoshida et al. | |
| 7,598,131 | B1* | 10/2009 | Micovic et al. | 438/172 |
| 2011/0068370 | A1* | 3/2011 | Kim et al. | 257/194 |
| 2011/0254055 | A1 | 10/2011 | Sato et al. | |
| 2011/0272741 | A1 | 11/2011 | Hwang | |
| 2013/0307026 | A1* | 11/2013 | Hwang et al. | 257/194 |

FOREIGN PATENT DOCUMENTS

| JP | 2010062552 A | 3/2010 |
| JP | 2011-129607 A | 6/2011 |
| JP | 2011165777 A | 8/2011 |

* cited by examiner

*Primary Examiner* — Bilkis Jahan
(74) *Attorney, Agent, or Firm* — Harness, Dickey & Pierce, P.L.C.

(57) ABSTRACT

According to example embodiments, a high electron mobility transistor (HEMT) includes a first semiconductor layer on a substrate and a second semiconductor layer on the first semiconductor layer. The first and second semiconductor layers define a recessed region. A semiconductor doped layer is in the recessed region of first and second semiconductor layers. A 2-dimensional electron gas (2DEG) region is at a portion of the first semiconductor layer adjacent to both sides of the semiconductor doped layer.

11 Claims, 9 Drawing Sheets

HIGH ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2012-0103608, filed on Sep. 18, 2012, in the Korean Intellectual Property Office, the disclosure of which is incorporated herein in its entirety by reference.

BACKGROUND

1. Field

Example embodiments relate to semiconductor devices, and more particularly, to a high electron mobility transistor (HEMT) including a semiconductor doped layer formed in a recessed region of first and second semiconductor layers.

2. Description of the Related Art

With the advancement of communication technology, research is actively being carried out regarding electronic devices that operate at high frequencies. In particular, much attention is being directed towards field-effect semiconductor devices, such as high electron mobility transistors (HEMTs), as power electronic devices used in a high frequency region.

A HEMT includes a heterojunction structure created by joining together adjacent semiconductor material layers having different band gaps. A semiconductor material layer having a large band gap functions as a donor. By forming a heterojunction with different band gap materials, a 2-dimensional electron gas (2DEG) layer is induced in a semiconductor material layer having a small band gap to improve the movement speed of electrons.

HEMTs may be used to increase the mobility of electron carriers and also be used as a high breakdown voltage transistor that is an example of power electronic devices. A HEMT includes a wide band gap semiconductor, such as a compound semiconductor, and may be used for high voltage applications due to its high breakdown voltage.

In general, since silicon commonly used in semiconductor devices has a low electron mobility, a high source resistance may occur. Thus, research is currently being conducted regarding the use of a Group III-V semiconductor compound in a HEMT. In particular, a gallium nitride (GaN)-based compound is receiving considerable attention as a promising material for HEMTs due to its wide band gap, high electron saturation velocity, and high chemical stability. Thus, HEMTs using GaN-based compounds are being actively developed as high temperature, high output, and high frequency electronic devices.

SUMMARY

Example embodiments relate to high electron mobility transistors (HEMTs) including a silicon doped layer in a recessed region of first and second semiconductor layers.

Example embodiments also relate to methods of manufacturing a HEMT including a silicon doped region formed in a recessed region of first and second semiconductor layers Additional aspects will be set forth in part in the description which follows and, in part, will be apparent from the description, or may be learned by practice of example embodiments.

According to example embodiments, a HEMT includes: a first semiconductor layer on a substrate; a second semiconductor layer on the first semiconductor layer, the first and second semiconductor layers defining a recessed region; a semiconductor doped layer in the recessed region of the first and second semiconductor layers, the semiconductor doped layer including a p-type doped region; and a 2-dimensional electron gas (2DEG) region at a portion of the first semiconductor layer located adjacent to both sides of the semiconductor doped layer.

In example embodiments, a source and a drain may be spaced part on the second semiconductor layer, a gate insulating layer may be on portions of the second semiconductor layer and the semiconductor doped layer where the source and the drain are not formed; and a gate may be on the gate insulating layer.

In example embodiments, a buffer layer may be between the substrate and the first semiconductor layer.

In example embodiments, the semiconductor doped layer may further include an n-type doped layer.

In example embodiments, the semiconductor doped layer may further include n-type doped regions that are adjacent to the 2DEG region, and the p-type doped region of the semiconductor doped layer may be between the n-type doped regions of the semiconductor doped layer.

In example embodiments, the gate, the gate insulating layer, and the p-type doped region may define a metal-insulator-semiconductor (MIS) structure.

In example embodiments, an insulating layer may be between the first semiconductor layer and the semiconductor doped layer.

In example embodiments, a gate insulating layer may extend between the second semiconductor layer and the semiconductor doped layer.

In example embodiments, the gate insulating layer may extend on both sides of the semiconductor doped layer.

In example embodiments, the first semiconductor layer may include at least one of gallium nitride (GaN), gallium arsenide (GaAs), indium nitride (InN), indium gallium nitride (InGaN), and aluminum gallium nitride (AlGaN).

In example embodiments, the second semiconductor layer may include at least one of aluminum nitride (AlN), AlGaN, aluminum indium nitride (AlInN), aluminum gallium indium nitride (AlGaInN), and aluminum gallium arsenide (AlGaAs).

According to example embodiments, a method of manufacturing a HEMT includes forming first and second semiconductor layers on a substrate; etching the first and second semiconductor layers to form a recessed region defined by the first and second semiconductor layers; and forming a semiconductor doped layer including a p-type doped region. The second semiconductor layer may be configured to induce a 2-dimensional electron gas (2DEG) region at a portion of the first semiconductor layer.

In example embodiments, the method may further include: forming a gate insulating layer on the second semiconductor layer and the semiconductor doped layer, removing portions of the gate insulating layer that are spaced apart; forming a source and a drain on the second semiconductor layer where the portions of the gate insulating layer was removed; and forming a gate on the gate insulating layer.

In example embodiments, the semiconductor doped layer may further include an n-type doped layer.

In example embodiments, the semiconductor doped layer may further include n-type doped regions at both sides of the p-type doped region of the semiconductor doped layer.

According to example embodiments, a high electron mobility transistor (HEMT) includes: a first semiconductor layer; a second semiconductor layer on the first semiconductor layer, the first and second semiconductor layers defining a recessed region, the second semiconductor layer being configured to induce a 2-dimensional electron gas (2DEG) region at a portion of the first semiconductor layer; first, second, and third semiconductor doped regions of alternating conductivity types in the recessed region of the first and second semiconductor layer, the first and third semiconductor doped region being closer than the second semiconductor doped region to the second semiconductor layer.

In example embodiments, the second semiconductor doped region may be p-type, the first and third semiconductor doped regions may be n-type, and at least one of the first to third semiconductor doped region may include silicon.

In example embodiments, an insulating layer may extend between at least one of the first to third semiconductor doped regions and at least one of the first and second semiconductor layers, and a gate may be on the insulating layer.

In example embodiments, a source and a drain may be on the semiconductor layer, and insulating layer may be between the source and the drain, and a gate may be on the insulating layer.

In example embodiments, a source and a drain may be on the second semiconductor layer, a gate may be on at least one of the first to third semiconductor doped regions, and a first insulating layer may have at least a portion in the recessed region of the first and second semiconductor layers.

BRIEF DESCRIPTION OF THE DRAWINGS

These and/or other aspects will become apparent and more readily appreciated from the following description of non-limiting embodiments, taken in conjunction with the accompanying drawings in which.

DETAILED DESCRIPTION

Figure 1A:
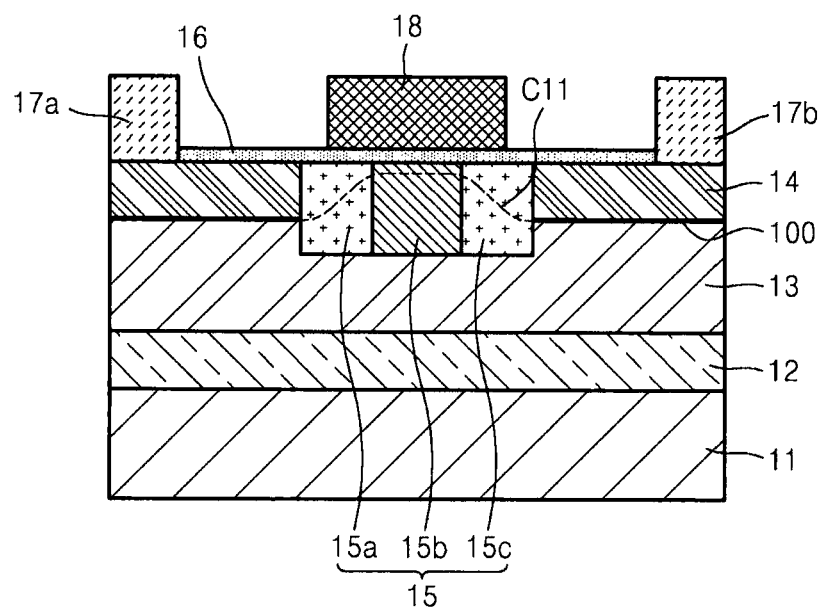
FIGS. 1A and 1B illustrate high electron mobility transistors (HEMTs) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

High electron mobility transistors (HEMT) and/or methods of manufacturing the same, according to example embodiments, will now be described more fully with reference to the accompanying drawings.

Figure 1B:
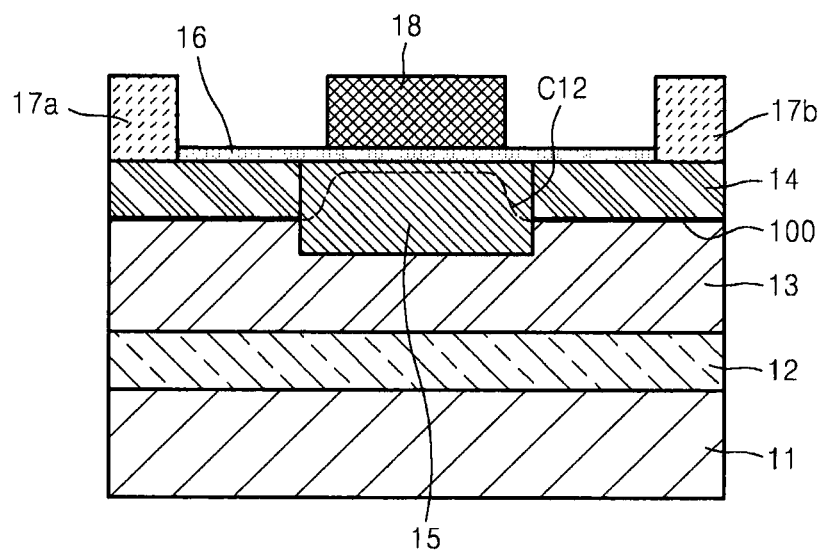

FIGS. 1A and 1B illustrate high electron mobility transistors (HEMTs) according to example embodiments. FIG. 1A illustrates a structure of the HEMT in which a semiconductor doped layer includes different types of doped regions, e.g., a p-type doped region and an n-type doped region. FIG. 1B illustrates a structure of a HEMT in which a semiconductor doped layer includes a p-type doped region having the same doping type, as the semiconductor doped layer.

Referring to FIGS. 1A and 1B, each of the HEMTs include a substrate 11, and a buffer layer 12, a first semiconductor layer 13, and a second semiconductor layer 14 sequentially stacked on the substrate 11 in this order. The first and second semiconductor layers 13 and 14 include a recessed region in which a semiconductor doped layer 15 is formed. A source 17a and a drain 17b are disposed on both sides of the second semiconductor layer 14. A gate insulating layer 16 is formed on portions of the second semiconductor layer 14 and the semiconductor doped layer 15 where the source and the drain 17a and 17b are not formed. A gate 18 overlies the gate insulating layer 16. A 2-Dimensional Electron Gas (2DEG) region 100 is formed as a channel region on a portion of the first semiconductor layer 13 that is close to an interface between the first and second semiconductor layers 13 and 14.

The semiconductor doped layer 15 may be formed by doping a semiconductor material with impurities and includes a region doped with p-type impurities. The semiconductor doped layer 15 may optionally further include an n-type doped region. It is possible to selectively determine locations in the semiconductor doped layer at which the p- and n-type doped regions are formed.

Referring to FIG. 1A, the semiconductor doped layer 15 includes a p-type doped region 15b and n-type doped regions 15a and 15c having different doping types. More specifically, the semiconductor doped layer 15 includes the n-type doped regions 15a and 15c that are adjacent to the 2DEG region 100, and the p-type doped region 15b interposed between the n-type doped regions 15a and 15c. Referring to FIG. 1B, the semiconductor doped layer 15 may only include a p-type doped region.

Figure 2:
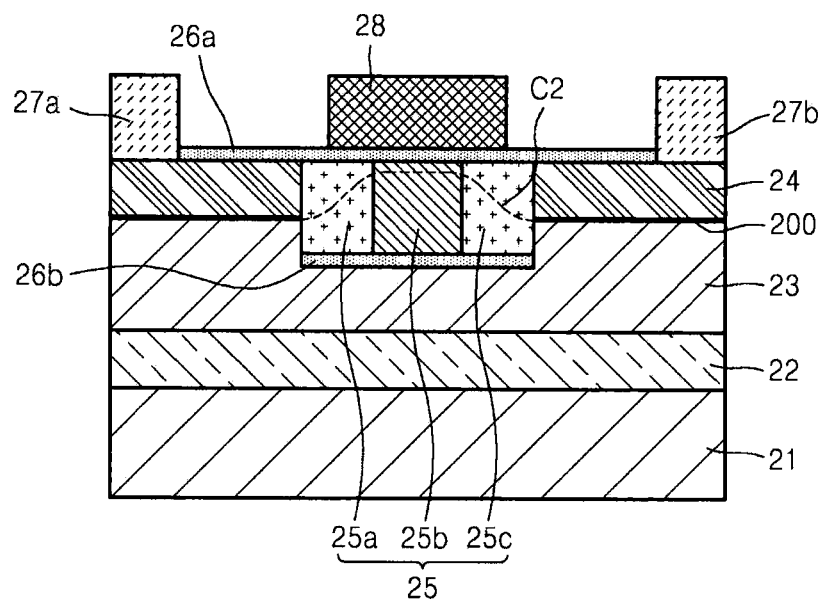
FIGS. 2 through 4 illustrate HEMTs according to example embodiments.
Figure 3:
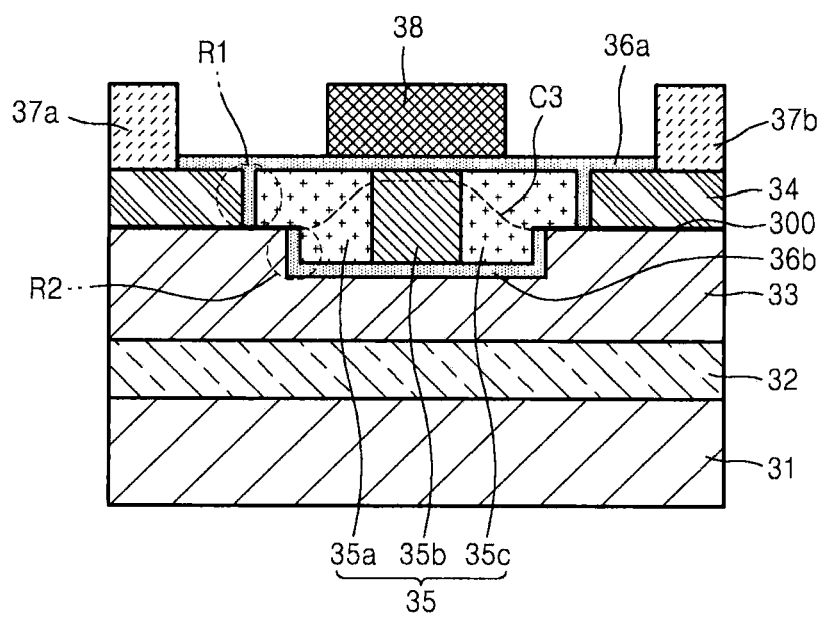
Figure 4:
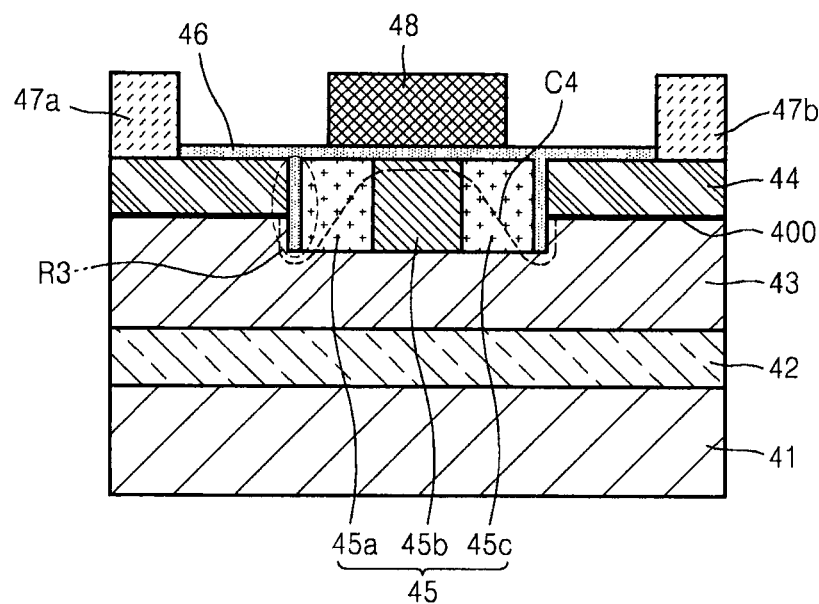

While FIGS. 2 through 4 illustrate each of semiconductor doped layers 25, 35, and 45 includes both p- and n-type doped regions, example embodiments are not limited thereto, and each of the semiconductor doped layers 25, 35, and 45 may only include a p-type doped region as illustrated in FIG. 1B.

When power is applied through the gate 18 to drive a HEMT, current C11 or C12 flows through the semiconductor doped layer 15 that is connected to the 2DEG region 100. A threshold voltage Vth of a HEMT according to example embodiments may be affected by a thickness of the gate insulating layer 16, a depth of the recessed region, and a doping concentration of the semiconductor doped layer 15. In particular, the threshold voltage Vth may be easily controlled by adjusting the impurity doping concentration of the p-type doped region 15b of the semiconductor doped layer 15.

Materials that may be used to form layers in a HEMT according to example embodiments will now be described. The materials for each layer shown in FIGS. 1A and 1B may also be used to form the same layers described with reference to FIGS. 2 through 4 and 6A through 6F.

The substrate 11 may be formed of any material as long as the substrate 11 may be used as a substrate of a semiconductor device. For example, the substrate 11 may be formed of silicon (Si), silicon carbide (SiC), or sapphire. The substrate 11 may also be doped with predetermined impurities.

The buffer layer 12 may be selectively formed to grow the overlying first semiconductor layer 13. A material of the buffer layer 12 may be selected according to a material of the first semiconductor layer 13. For example, the buffer layer 12 may be formed of aluminum nitride (AlN) or aluminum gallium nitride (AlGaN).

The first and second semiconductor layers 13 and 14 may be formed of semiconductor materials with different band gaps. The second semiconductor layer 14 may be formed of a material having a greater polarizability and wider band gap than that of the first semiconductor layer 13. The first semiconductor layer 13 may be a channel region, and the second semiconductor layer 14 may be a channel supply layer.

The first semiconductor layer 13 may be formed of a Group III-V semiconductor compound such as one of GaN, gallium arsenide (GaAs), indium nitride (InN), indium gallium nitride (InGaN), or AlGaN. The second semiconductor layer 14 may have a multilayer structure composed of a plurality of layers with different Al or In compositions.

The first and second semiconductor layers 13 and 14 may be made of compound semiconductors having different lattice constants. A 2DEG region created by a heterojunction structure consisting of the first and second semiconductor layers 13 and 14 may be formed at a portion of the first semiconductor layer 13 near an interface between the first and second semiconductor layers 13 and 14.

The semiconductor doped layer 15 may be formed of a semiconductor material, such as Si and include either or both of p- and n-type doped regions according to the type of impurities that the semiconductor doped layer 15 is doped with. The semiconductor doped layer 15 may be formed to a thickness of about 10 nm to about 200 nm, but it is not limited thereto.

In example embodiments, the semiconductor doped layer 15 may be formed in the recessed region of the first and second semiconductor layers 13 and 14, so that the 2DEG region 100 has a partially split structure.

When power is applied through the gate 18 to drive the HEMT, the current C11 or C12 may flow through the semiconductor doped layer 15. A threshold voltage Vth may be controlled by adjusting a doping concentration of the p-type doped region 15b. For example, the p-type doped region 15b may have a doping concentration from about $10^{16}$ to about $10^{18}$/cm$^3$. However, it is not limited thereto.

The gate insulating layer 16 and the gate 18 are disposed on the p-type doped region 15b of the semiconductor doped layer 15, thereby creating a metal-insulator-semiconductor (MIS) structure and reducing (and/or preventing) an increase in the on resistance of the HEMT.

The gate insulating layer 16 may be made of an insulating or dielectric material, such as silicon oxide, silicon nitride, aluminum oxide, or hafnium (Hf) oxide.

The source 17a, the drain 17b, and the gate 18 may be formed of a conductive material, such as a metal, a metallic alloy, a conductive metal oxide, or a conductive metal nitride. Some examples of the conductive material are gold (Au), silver (Ag), Hf, tungsten (W), Al, indium-tin-oxide (ITO), titanium nitride (TiN), and tungsten nitride (WN). The source 17a, the drain 17b, and the gate 18 may be formed of the same conductive material.

FIG. 2 illustrates a HEMT according to example embodiments.

Referring to FIG. 2, the HEMT includes a substrate 21, and a buffer layer 22, a first semiconductor layer 23, and a second semiconductor layer 24 sequentially stacked on the substrate 21 in this order.

The first and second semiconductor layers 23 and 24 include a recessed region having an insulating layer 26a and a semiconductor doped layer 25 therein. The semiconductor doped layer 25 includes a p-type doped region. Optionally, it may further include n-type doped regions. For example, the semiconductor doped layer 25 may include a p-type doped region 25b. Alternatively, the semiconductor doped layer 25 may include n-type doped regions 25a and 25c and the p-type doped region 25b interposed between the n-type doped regions 25a and 25c. A source 27a and a drain 27b are disposed on both sides of the second semiconductor layer 24. A gate insulating layer 26a is formed on portions of the second semiconductor layer 24 and the semiconductor doped layer 25 where the source and the drain 27a and 27b are not formed. A gate 28 overlies the gate insulating layer 26a. The insulating layer 26b may be formed of the same material as the gate insulating layer 26a.

When power exceeding a threshold voltage Vth is applied through the gate 28, current C2 may flow through the semiconductor doped layer 25 to a 2DEG region 200. The threshold voltage Vth may be controlled by adjusting a doping concentration of the p-type doped region 25b.

FIG. 3 illustrates a HEMT according to example embodiments.

Referring to FIG. 3, the HEMT includes a substrate 31, and a buffer layer 32, a first semiconductor layer 33, and a second semiconductor layer 34 sequentially stacked on the substrate 31 in this order. The first and second semiconductor layers 33 and 34 include a recessed region having an insulating layer 36a and a semiconductor doped layer 35 therein. The semiconductor doped layer 35 includes a p-type doped region. Optionally, the semiconductor doped layer 35 may further include n-type doped regions. For example, the semiconductor doped layer 35 may include n-type doped regions 35a and 35c and a p-type doped region 35b disposed between the n-type doped regions 35a and 35c. A source 37a and a drain 37b are disposed on both sides of the second semiconductor layer 34. A gate insulating layer 36a is formed on portions of the second semiconductor layer 34 and the semiconductor doped layer 35 where the source and the drain 37a and 37b are not formed. A gate 38 overlies the gate insulating layer 36a. The gate insulating layer 36a extends down in a region R1 between the second semiconductor layer 34 and the semiconductor doped layer 35, and the insulating layer 36b extends up in a region R2 between the first semiconductor layer 33 and the p-type doped region 35b. The insulating layer 36b may be formed of the same material as the gate insulating layer 36a.

When power exceeding a threshold voltage Vth is applied to the HEMT shown in FIG. 3 through the gate 38, current C3 may flow through the semiconductor doped layer 35 to a 2DEG region 300. The threshold voltage Vth may be controlled by adjusting a doping concentration of the p-type doped region 35b of the semiconductor doped layer 35.

FIG. 4 illustrates a HEMT according to according to example embodiments.

Referring to FIG. 4, the HEMT includes a substrate 41, and a buffer layer 42, a first semiconductor layer 43, and a second semiconductor layer 44 sequentially stacked on the substrate 41 in this order. The first and second semiconductor layers 43 and 44 include a recessed region having a semiconductor doped layer 45 therein. The semiconductor doped layer 45 includes a p-type doped region. Optionally, the semiconductor doped layer 45 may further include n-type doped regions. For example, the semiconductor doped layer 45 may include n-type doped regions 45a and 45c and a p-type doped region 45b disposed between the n-type doped regions 45a and 45c. A source 47a or a drain 47b is disposed on either side of the second semiconductor layer 44. A gate insulating layer 46 is formed on portions of the second semiconductor layer 44 and the semiconductor doped layer 45 where the source and the drain 47a and 47b are not formed. A gate 48 overlies the gate insulating layer 46. The gate insulating layer 46 extends down in a region R3 on both sides of the recessed region.

When power exceeding a threshold voltage Vth is applied through the gate 48, current C4 may flow across the semiconductor doped layer 45. Since the gate insulating layer 46 extends down in the region R3 between the semiconductor doped layer 45 and the 2DEG region 400, the current C4 flows from the first semiconductor layer 43 under the region R3 into the semiconductor doped layer 45. The threshold voltage Vth may be controlled by adjusting a doping concentration of the p-type doped region 45b of the semiconductor doped layer 45.

The semiconductor doped layer may be formed in the recessed region of the first and second semiconductor layers 43 and 44. Thus, it is possible to control a threshold voltage of the HEMT and reduce the on resistance thereof by adjusting an impurity doping concentration of the p-type doped region 45b.

FIGS. 5A through 5E illustrate a method of manufacturing the HEMT of FIG. 1A, according to example embodiments.

Figure 5A:
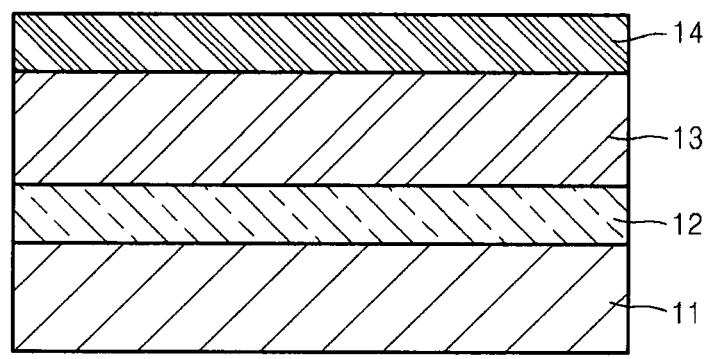
FIGS. 5A through 5E illustrate a method of manufacturing a HEMT, according to example embodiments.

Referring to FIG. 5A, the buffer layer 12, the first semiconductor layer 13, and the second semiconductor layer 14 are sequentially formed on the substrate 11 in this order. The substrate 11 may be made of Si, SiC, or sapphire. The buffer layer 12 may be selectively formed to grow the overlying first semiconductor layer 13 by using AlN or AlGaN. The first and second semiconductor layers 13 and 14 may be formed of GaN and AlGaN, respectively.

Figure 5B:
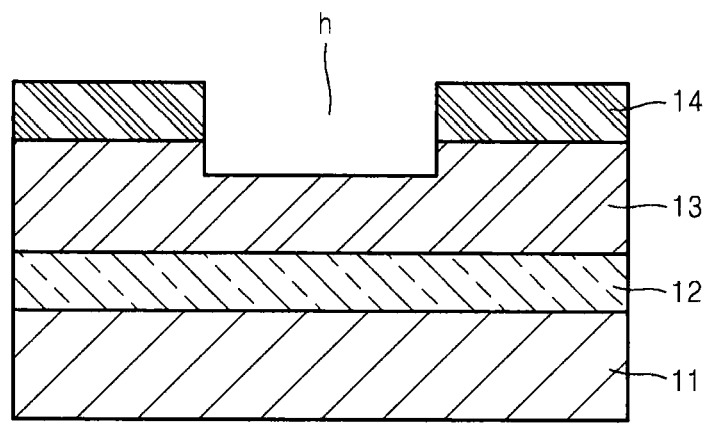

Referring to FIG. 5B, an etching process is then performed to form a recessed region h in the second and first semiconductor layers 14 and 13 by considering a thickness of the semiconductor doped layer 15 to be subsequently formed therein.

Figure 5C:
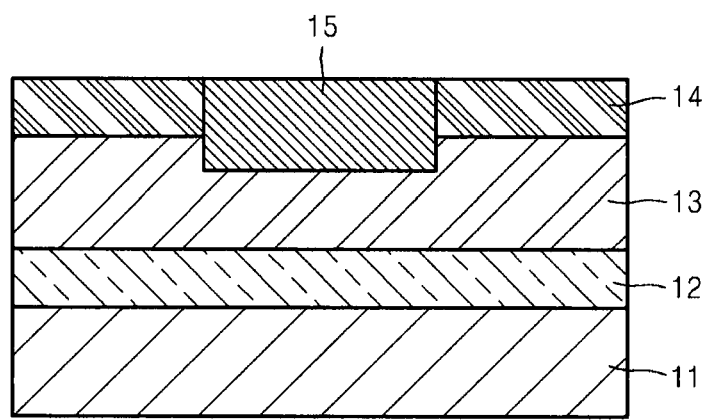
Figure 5D:
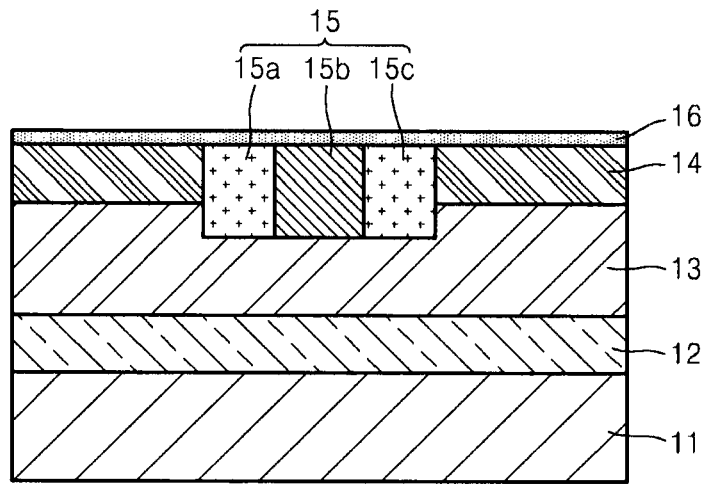

Referring to FIGS. 5C an 5D, the recessed region h is coated with a semiconductor material to form the semiconductor doped layer 15. For example, the semiconductor layer 15 may be made of polysilicon. The semiconductor doped layer 15 may be formed by using chemical vapor deposition (CVD), physical vapor deposition (PVD), or various other methods without limitation. Next, n- or p-type doping is performed on the semiconductor doped layer 15 by adjusting doping materials so that the semiconductor doped layer 15 includes the n-type doped regions 15a and 15c and the p-type doped region 15b. In particular, a threshold voltage of the HEMT may be controlled by adjusting the doping concentration of the p-type doped region 15b. Thereafter, the gate insulating layer 16 is formed on the second semiconductor layer 14 and the semiconductor doped layer 15 by using silicon oxide, silicon nitride, or other insulating materials.

Figure 5E:
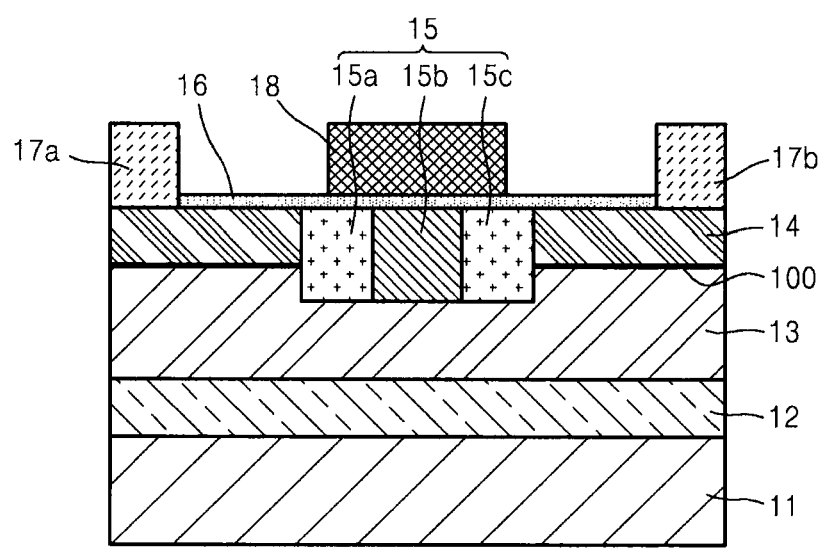

Referring to FIG. 5E, two sides of the gate insulating layer 16 are removed to partially expose the second semiconductor layer 14 and then form the source and drain 17a and 17b. The gate 18 is then formed on a portion of the gate insulating layer 16 corresponding to the semiconductor doped layer 15. The source 17a, the drain 17b, and the gate 18 may be formed of the same or different conductive materials.

FIGS. 6A through 6F illustrate HEMTs according to example embodiments.

Figure 6A:
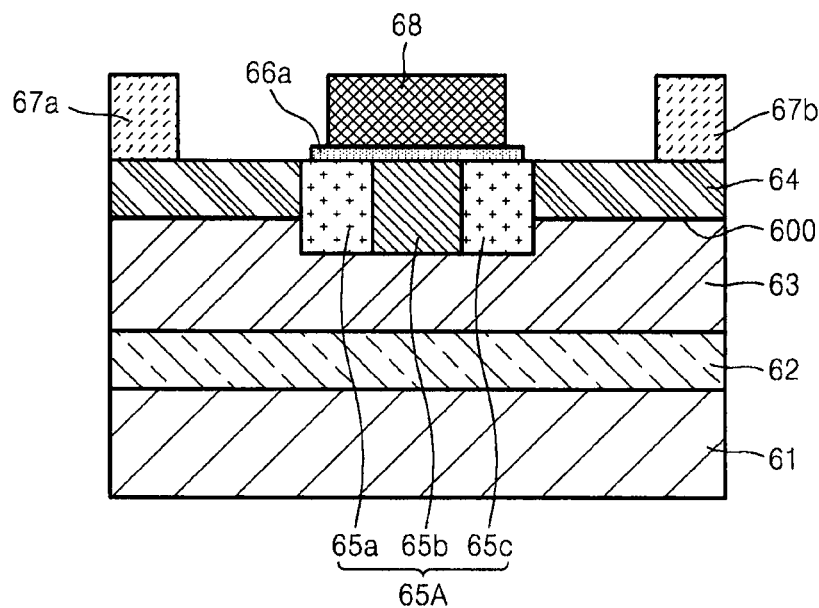
FIGS. 6A through 6F illustrate HEMTs according to example embodiments.

Referring to FIG. 6A, a HEMT according to example embodiments may include a substrate 61, a buffer layer 62 on the substrate 61, first and second semiconductor layers 63 and 64 on the buffer layer 62, a source 67a and a drain 67b on both sides of the second semiconductor layer 64, a semiconductor doped layer 65A in a recess defined by the first and second semiconductor layer 63 and 64, a gate insulating layer 66a on the semiconductor doped layer 65, and a gate 68 on the gate insulating layer 66. A 2DEG region 600 may be formed as a channel region on a portion of the first semiconductor layer 63 that is close to an interface between the first and second semiconductor layers 63 and 64. The semiconductor doped layer 65A may be formed by doping a semiconductor layer (e.g., silicon) with n-type and p-type impurities. For example, the semiconductor doped layer may include regions 65a and 65c that are doped with an n-type impurity and region 65b that is doped with a p-type impurity.

The HEMT illustrated in FIG. 6A may be the same as the HEMT illustrated in FIG. 1, except for the structure of the gate insulating layer. In FIG. 6A, the gate insulating layer 66 is spaced apart from the source 67a and drain 67b, whereas FIG. 1 illustrates a HEMT that includes a gate insulating layer 16 that is not spaced apart from the source 17a and drain 17b. Alternatively, although not shown, the gate insulating layer 66 may be spaced apart from only one of the source 67a and the drain 67b.

Figure 6B:
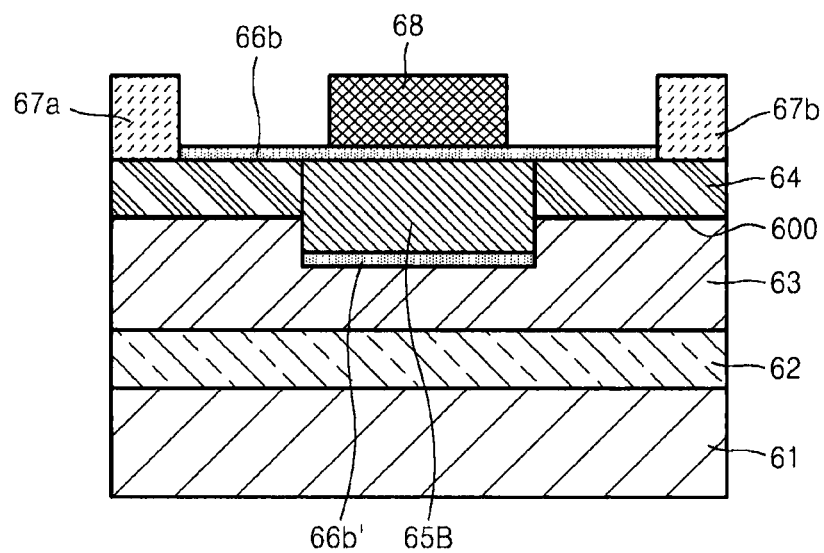

Referring to FIG. 6B, a HEMT according to example embodiments may include a substrate 61, a buffer layer 62 on the substrate 61, first and second semiconductor layers 63 and 64 on the buffer layer 62, a source 67a and a drain 67b on both sides of the second semiconductor layer 64, a semiconductor doped layer 65B in a recess defined by the first and second semiconductor layer 63 and 64, a gate insulating layer 66b on the semiconductor doped layer 65B, and a gate 68 overlying the gate insulating layer 66b. A 2DEG region may formed as a channel region on a portion of the first semiconductor layer 63 that is close to an interface between the first and second semiconductor layers 63 and 64. The semiconductor doped layer 65B may be formed by doping a semiconductor layer (e.g., silicon) with p-type impurities.

The HEMT illustrated in FIG. 6A may be the same as the HEMT illustrated in FIG. 2, except the HEMT illustrated in FIG. 6B further includes an insulating layer 66b' between a bottom surface of the semiconductor doped layer 65B and the first semiconductor layer 63. The insulating layers 66b and 66b' may be formed of the same materials as the gate insulating layer 16 described previously with respect to FIGS. 1A and 1B.

Figure 6C:
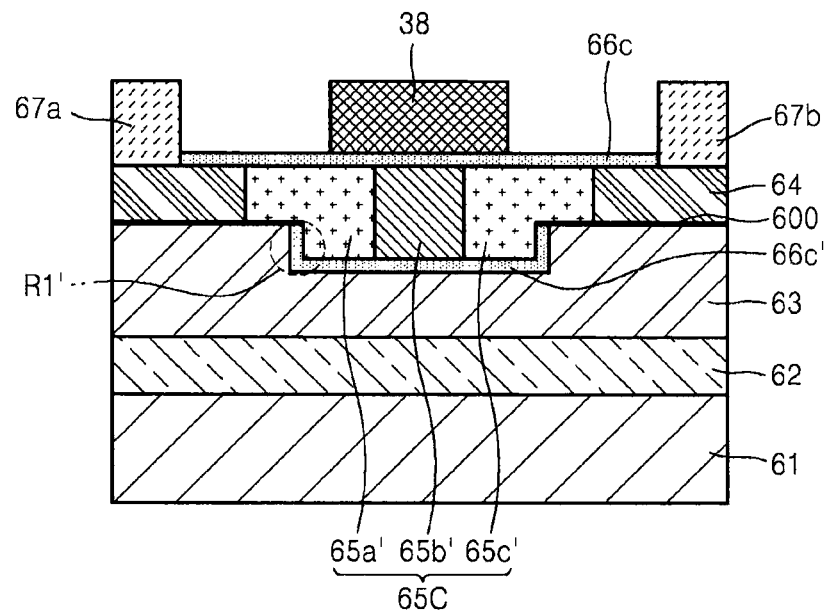

Referring to FIG. 6C, a HEMT according to example embodiments may be the same as the HEMT illustrated in FIG. 3, except FIG. 6C illustrates a HEMT where the gate insulating layer 66c does not include portions that extend between the second semiconductor layer 64 and sides of the semiconductor doped layer 65C.

The semiconductor doped layer 65C may be formed by doping a semiconductor layer (e.g., silicon) with n-type and p-type impurities. For example, the semiconductor doped layer 65C may include regions 65a' and 65c' that are doped with an n-type impurity and region 65b' that is doped with a p-type impurity.

Like FIG. 3, the HEMT illustrated in FIG. 6 may include an insulating layer 66c' between a bottom surface of the semiconductor doped layer 65C and the first semiconductor layer 63, and the insulating layer 66c' may also extend up in a region R1' between the first semiconductor layer 63 and sidewalls of the regions 65a' and 65c' of the semiconductor doped layer 65C.

Figure 6D:
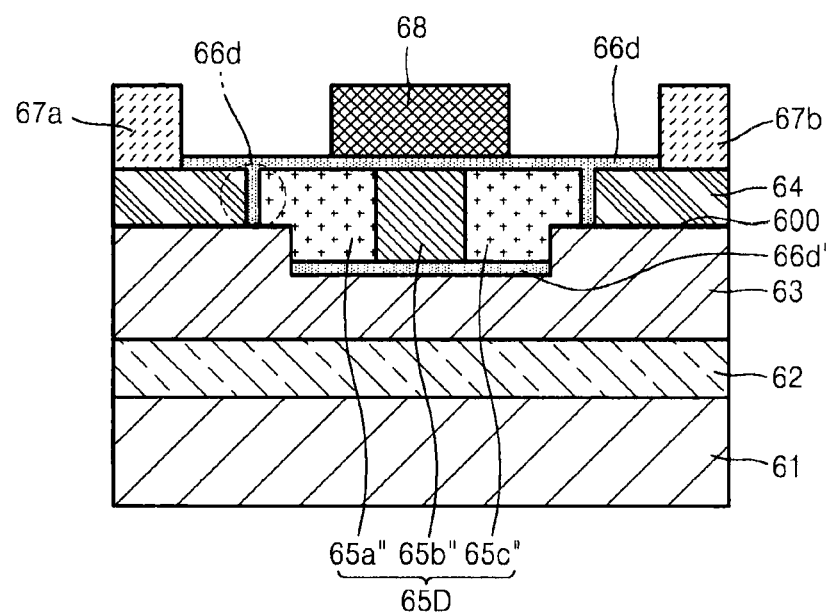

Referring to FIG. 6D, a HEMT according to example embodiments may be the same as the HEMT illustrated in FIG. 3, except the structure of the insulating layer 66d' is different than the structure of the insulating layer 26b in FIG. 3. The insulating layer 66d' extends between a lower surface of the semiconductor doped layer 65D and the first semiconductor layer 63. The HEMT in FIG. 6D also includes a gate insulating layer 66d with portions that extend between sides of the semiconductor doped layer 65D and the second semiconductor layer 64.

The semiconductor doped layer 65D may be formed by doping a semiconductor layer (e.g., silicon) with n-type and p-type impurities. For example, the semiconductor doped layer 65D may include regions 65a'' and 65c'' that are doped with an n-type impurity and region 65b'' that is doped with a p-type impurity.

Figure 6E:
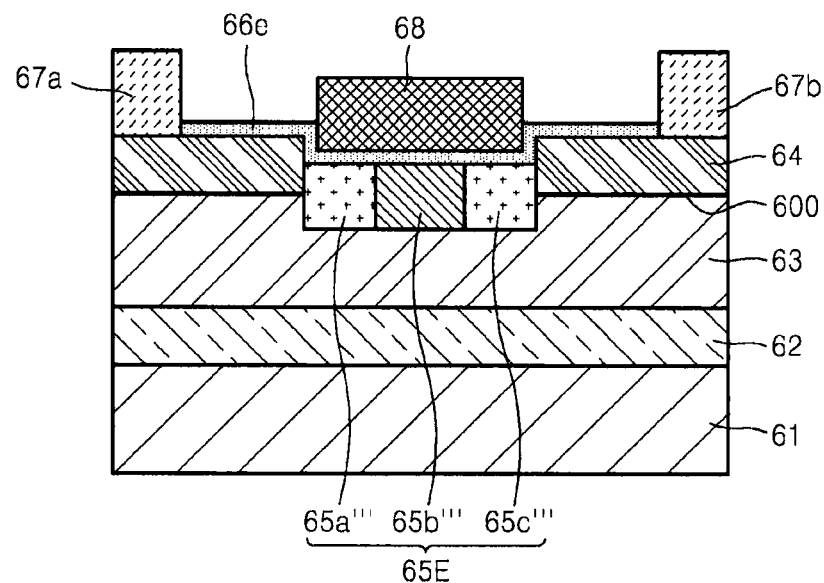

Referring to 6E, a HEMT according to example embodiments may be the same as the HEMT illustrated in FIG. 1, except for the structure of gate insulating layer 66e and the semiconductor doped layer 65E compared to the HEMT in FIG. 1. As shown in FIG. 6E, the semiconductor doped layer 65E may have a thickness that is less than a depth of the recessed region defined by the first and second semiconductor layers 63 and 64. The gate insulating layer 66e may extend along the second semiconductor layer 64 and over the semiconductor doped layer 65E.

The semiconductor doped layer 65E may be formed by doping a semiconductor layer (e.g., silicon) with n-type and p-type impurities. For example, the semiconductor doped layer 65E may include regions 65a''' and 65c''' that are doped with an n-type impurity and region 65b''' that is doped with a p-type impurity.

Figure 6F:
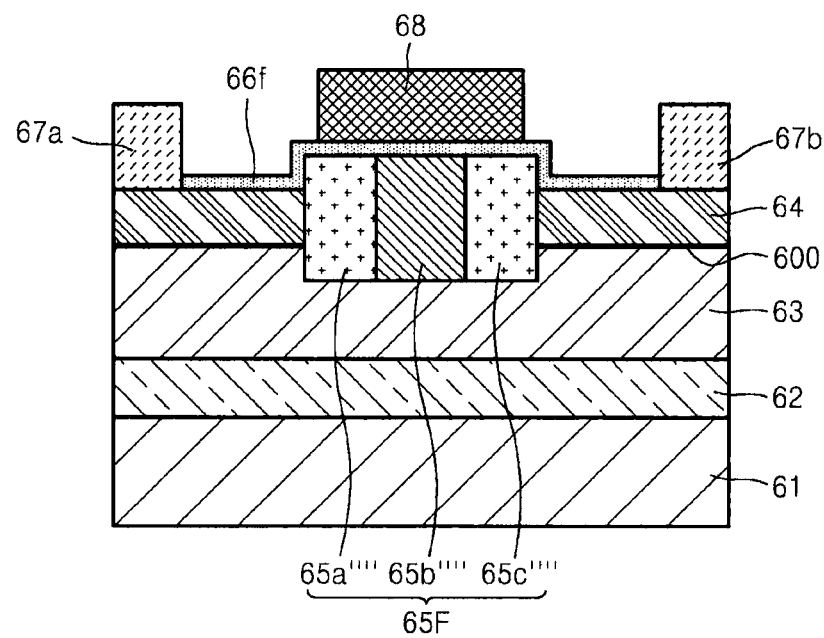

Referring to 6F, a HEMT according to example embodiments may be the same as the HEMT illustrated in FIG. 1, except for the structure of gate insulating layer 66f and the semiconductor doped layer 65F compared to the HEMT in FIG. 1. As shown in FIG. 6F, the semiconductor doped layer 65E may have a thickness that is greater than a depth of the recessed region defined by the first and second semiconductor layers 63 and 64. The gate insulating layer 66f may extend along the second semiconductor layer 64 and over the semiconductor doped layer 65F.

The semiconductor doped layer 65F may be formed by doping a semiconductor layer (e.g., silicon) with n-type and p-type impurities. For example, the semiconductor doped layer 65E may include regions 65a'''' and 65c'''' that are doped with an n-type impurity and region 65b'''' that is doped with a p-type impurity.

Figure 7:
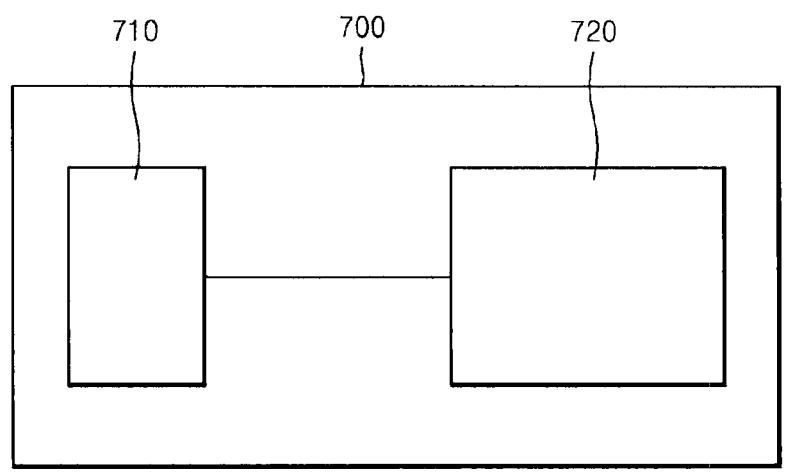
FIG. 7 illustrates a plan view of an integrated circuit (IC) module including a HEMT according to example embodiments.

FIG. 7 illustrates a plan view of an IC module including a HEMT according to example embodiments.

While FIGS. 6A, 6C, 6D, 6E, and 6F each illustrate semiconductor doped layers 65A, 65C, 65D, 65E, and 65F that include both p- and n-type doped regions, example embodiments are not limited thereto, and each of the semiconductor doped layers 65A, 65C, 65D, 65E, and 65F may only include a p-type doped region as illustrated in FIG. 1B.

Referring to FIG. 7, the IC module may include a HEMT 710 and a circuit 720 for controlling operation of the HEMT 710. The HEMT may include one of the foregoing HEMTs illustrated in FIGS. 1A, 1B, 2, 3, 4, and 6A through 6G according to example embodiments.

As described above, according to example embodiments, a recessed region of first and second semiconductor layers includes a semiconductor doped region. By adjusting a doping concentration of the semiconductor doped region, a threshold voltage Vth of a HEMT may be easily controlled and the on resistance thereof may be reduced.

It should be understood that example embodiments described herein should be considered in a descriptive sense only and not for purposes of limitation. Descriptions of features or aspects within each embodiment should typically be considered as available for other similar features or aspects in other embodiments. While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
 a first semiconductor layer on a substrate;
 a second semiconductor layer on the first semiconductor layer,
 the first and second semiconductor layers defining a recessed region;
 a semiconductor doped layer in the recessed region of the first and second semiconductor layers,
  the semiconductor doped layer including a p-type doped region; and
 a 2-dimensional electron gas (2DEG) region at a portion of the first semiconductor layer adjacent to both sides of the semiconductor doped layer.

2. The HEMT of claim 1, further comprising:
 a buffer layer between the substrate and the first semiconductor layer.

3. The HEMT of claim 1, wherein the semiconductor doped layer further includes an n-type doped layer.

4. The HEMT of claim 1, wherein
 the semiconductor doped layer further includes n-type doped regions that are adjacent to the 2DEG region, and the p-type doped region of the semiconductor doped layer is between the n-type doped regions of the semiconductor doped layer.

5. The HEMT of claim 1, wherein the gate insulating layer extends along both sides of the semiconductor doped layer.

6. The HEMT of claim 1, wherein the first semiconductor layer includes at least one of gallium nitride (GaN), gallium arsenide (GaAs), indium nitride (InN), indium gallium nitride (InGaN), and aluminum gallium nitride (AlGaN).

7. The HEMT of claim 1, wherein the second semiconductor layer includes at least one of aluminum nitride (AlN), AlGaN, aluminum indium nitride (AlInN), aluminum gallium indium nitride (AlGaInN), and aluminum gallium arsenide (AlGaAs).

8. The HEMT of claim 1, further comprising:
 a source and a drain spaced apart on the second semiconductor layer;
 a gate insulating layer on the semiconductor doped layer and a portion of the second semiconductor layer where the source and the drain are not on the second semiconductor layer; and
 a gate on the gate insulating layer.

9. The HEMT of claim 8, wherein the gate, the gate insulating layer, and the p-type doped region define a metal-insulator-semiconductor (MIS) structure.

10. The HEMT of claim 8, further comprising:
 an insulating layer between the first semiconductor layer and the semiconductor doped layer.

11. The HEMT of claim 10, wherein the gate insulating layer extends between the second semiconductor layer and the semiconductor doped layer.

* * * * *